United States Patent
Zhou et al.

(10) Patent No.: US 6,194,987 B1
(45) Date of Patent: Feb. 27, 2001

(54) INDUCTANCE DEVICE

(75) Inventors: Shu-Ang Zhou, Älvsjö-Stockholm; Per Thomas Lewin, Orsala, both of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/274,326

(22) Filed: Mar. 23, 1999

(30) Foreign Application Priority Data

Mar. 24, 1998 (SE) .................................................... 9800989

(51) Int. Cl.$^7$ ........................................................ H01F 5/00
(52) U.S. Cl. ............................................. 336/200; 336/232
(58) Field of Search ..................................... 336/200, 232, 336/223; 257/531

(56) References Cited

U.S. PATENT DOCUMENTS

| | | |
|---|---|---|
| 2,843,829 | 7/1958 | Slate . |
| 4,638,270 * | 1/1987 | Machemer ............................ 333/175 |
| 5,034,717 | 7/1991 | Shinkai . |
| 5,852,866 * | 12/1998 | Kuettner et al. ....................... 29/608 |
| 5,886,394 * | 3/1999 | Leeuwenburgh ...................... 257/531 |
| 5,892,425 * | 4/1999 | Kuhn et al. ........................... 336/200 |

OTHER PUBLICATIONS

Nguyen et al., "Silc–Compatible Inductors and LC Passive Filters", *IEEE Journal of Solid–State Circuits*, vol. 25, No. 4, 1990 No Date.

"Microwave Inductors and Capacitors in Standard Multi-level Interconnect Silicon Technology" *IEEE Transactions on Microwave Theory and Technique*, vol. 44, No. 1, Jan. 1996.

\* cited by examiner

*Primary Examiner*—Lincoln Donovan
*Assistant Examiner*—Tuyen Nguyen
(74) *Attorney, Agent, or Firm*—Burns, Doane, Swecker & Mathis, L.L.P.

(57) ABSTRACT

An inductance device has first and second terminals and two conductors. Each conductor forms a loop between the terminals such that a current provided to the first terminal is divided between the conductors. Each current generates a magnetic field. The conductors are disposed such that the combined magnetic field generated by the conductor currents in a space between the conductors is greater than the magnetic field generated by each of the conductors in that space.

13 Claims, 4 Drawing Sheets

INDUCTANCE DEVICE

BACKGROUND

The present invention relates to an inductance means. The invention also relates to an integrated circuit chip including such an inductance means.

A circuit component is frequently described as having an impedance Z with a resistive part and a reactive part. In other words a component has a resistance R and a reactance X. The reactance X may include an inductive component, rendering the impedance of the component inductive and resistive.

The article "SiIc-Compatible Inductors and LC Passive Filters" (IEEE Journal of Solid-State Circuits, Vol. 25, No. 4, 1990) by N. M. Nguyen and R. G. Meyer, discloses a square spiral inductor which is fabricated of aluminium on a silicon substrate. The disclosed inductor having an inductance of 9.7 nH also had a series resistance of 15.4 Ohm and a maximum Q-value below 4 at 0.9 GHz. Hence, the performance of the disclosed inductor is limited by the metal resistance.

The article "Microwave Inductors and Capacitors in Standard Multilevel Interconnect Silicon Technology" (IEEE Transactions on Microwave Theory and Technique, Vol. 44, No 1 January 1996) discloses a spiral inductor on a silicon substrate. The disclosed inductor has four turns, and thicker metal wires which are realized in standard 0.8 micrometer BiCMOS silicon technology by connecting multiple metal layers with dense via arrays. The disclosed spiral inductor has three metal levels mutually connected with a via array, and an underpass at a lowest of four metal levels provided in the silicon substrate. The article reports an estimated Q-value of 9.3 at 4 GHz for such an inductor.

SUMMARY

The invention relates to the problem of providing an inductor having an advantageously high Q-value. More particularly the invention relates to the problem of providing an inductance device having a low resistive loss while providing a high inductance value.

Furthermore the invention relates to the problem of providing an integrated circuit inductor with advantageous performance characteristics at high frequencies. Integrated circuit inductors according to the prior art suffer from particularly low Q-values.

A further object of the invention is to achieve an integrated circuit inductor operating at frequencies above 300 MHz with an improved Q-value.

These problems are addressed, according to an embodiment of the invention, by providing an inductance means comprising a first and a second terminal and two conductors. Each conductor forms a loop between the terminals such that a current provided to the first terminal is divided between the conductors. Each current generates a magnetic field. The conductors are disposed such that the combined magnetic field generated by the conductor currents in a space between the conductors is greater than the magnetic field generated by each of the conductors in that space.

This design has the advantage of reducing the resistance value for the inductance device since—from an electric point of view—the two conductors are coupled in parallel.

Advantageously, this design also has the surprising effect of providing a high inductance value. This is particularly surprising since it is common knowledge in the art of electrotechnology that parallel coupling of inductors leads to lower net inductance, under the same principle governing parallel coupling of resistance.

The inductance device also obtains an advantageously increased quality factor.

A further advantage afforded by the inductance device according to embodiments of the invention is the reduction or elimination of electromagnetic interference on other circuits or components disposed next to the inductance device.

BRIEF DESCRIPTION OF THE DRAWINGS

For simple understanding of the present invention, it will be described by means of examples and with reference to the accompanying drawings, of which.

DETAILED DESCRIPTION

Figure 1:
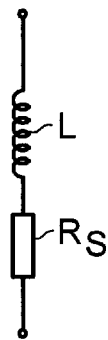
FIG. 1 is a schematic equivalent representation of an inductor, according to prior art, having an inductive and a resistive impedance.
Figure 2:
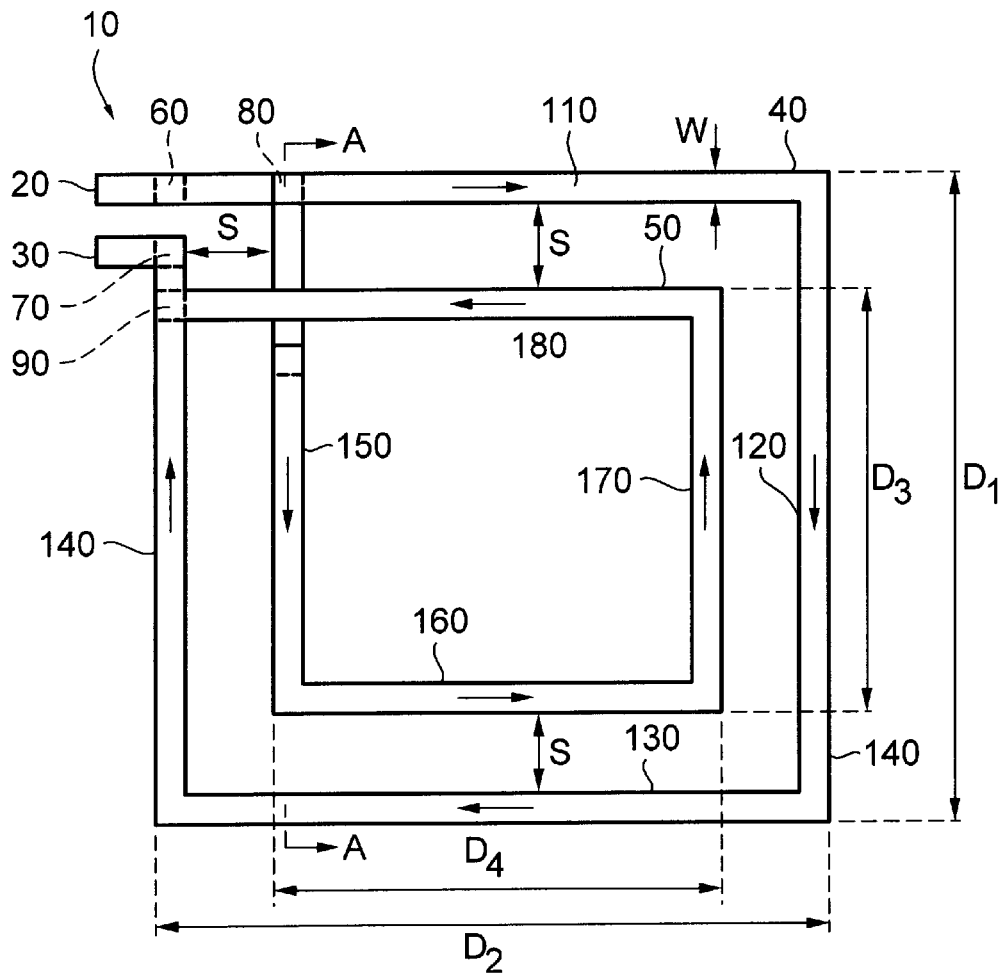
FIG. 2 is a top plan view of an inductance device according to an embodiment of the invention.

FIG. 2 is a top plan view of an inductance device 10 according to an embodiment of the invention.

The inductance device has a pair of terminals 20 and 30 for receiving an electric signal. A first elongated conductor 40, formed as a loop, is coupled between the terminals. A second elongated conductor 50, also formed as a loop and coupled between the terminals, is disposed geometrically parallel to the first conductor. With reference to FIG. 2, the conductors are coupled to the terminals 20, 30 such that a current directed into the first terminal 20 flows in a first direction, e.g. clockwise, through the first loop 40 and in the opposite direction, i.e. anticlockwise, through the second loop 50. Arrows on the conductors in FIG. 2 indicate these current directions.

In the embodiment shown in FIG. 2 the first conductor loop is a substantially square loop, having a first terminal 60 and a second terminal 70. The first loop 40 is square-shaped and has outer side measures D1×D2, where D1=250 micrometer and D2=250 micrometer. The first conductor 40 has four straight legs, the first leg 110 being connected to terminal 60, the second leg 120 joining the first leg with the third leg 130. The third leg 130 is arranged geometrically parallel to the first leg 110 at a distance D1−2W from the first leg. The fourth leg 140 of the first conductor connects the third leg 130 with terminal 70.

The second loop 50, also square-shaped, is disposed substantially inside the first loop 40, at a distance S=60 micrometer from the first conductor 40. The second square-shaped loop 50 has outer measures D3×D4, where D3=110 micrometer and D4=110 micrometer. The conductors have a width W=10 micrometer.

The second conductor has a first terminal 80 and a second terminal 90. With reference to FIG. 2 the first terminal 80 is disposed at the distance S, along the first conductor, from the first terminal 60. At terminal 80 conductor 50 branches from the first leg 110 of conductor 40 in a substantially orthogonal direction so as to run at the distance S along the fourth leg 140 of conductor 50. Hence, the second conductor 50 has a first leg 150, which is directed orthogonally to the first leg 110 of the first conductor 40. The second leg 160 of conductor 50 runs parallel with the third leg 130 of conductor 40 at distance S from it. The third leg 170 of conductor 50 runs parallel with the second leg 120 of conductor 40. The fourth leg 180 of conductor 50 runs parallel with the first leg 110 of conductor 40, crossing over the first leg 150 before connecting with the leg 140 at terminal 90.

Figure 3:
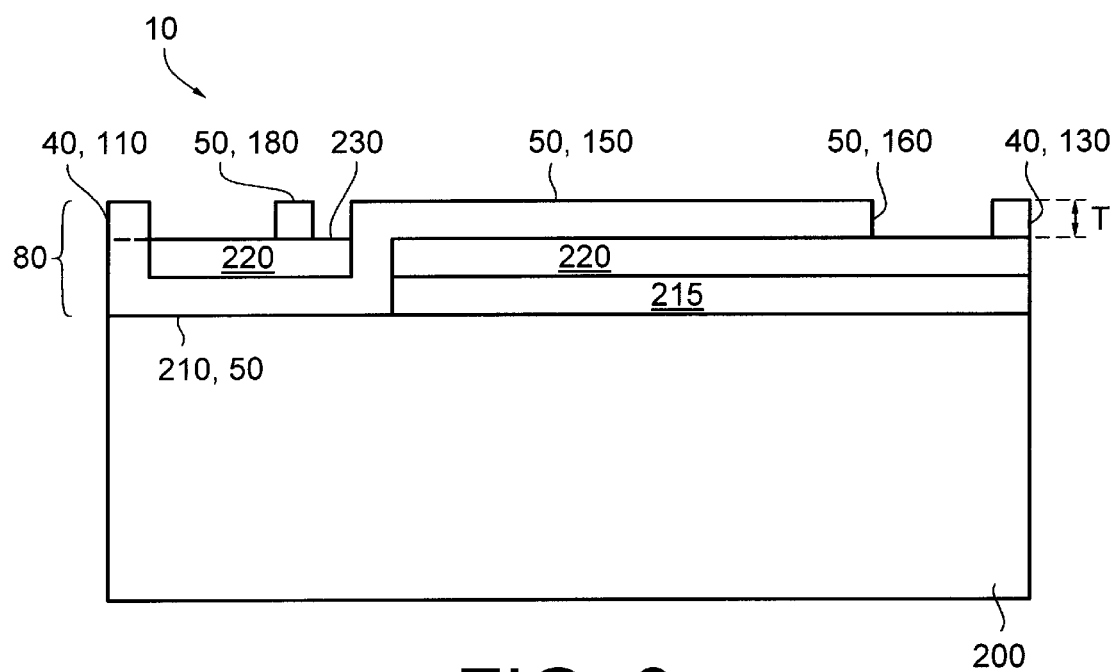
FIG. 3 is a sectional side view along A—A, as seen in the direction of arrows A, of the inductance device shown in FIG. 2

FIG. 3 is a sectional side view along A—A, as seen in the direction of arrows A, of the inductance device 10 shown in FIG. 2. The inductance device 10 is disposed on a substrate 200.

A lower portion 210 of the second conductor 50 is disposed directly on the substrate 200. Above conductor portion 210 there is a dielectric layer 220 isolating it from the fourth leg 180 of conductor 50. In this manner the first leg 150 passes under the fourth leg 180 of conductor 50.

A first dielectric layer 215 is disposed on the substrate, between dielectric layer 220 and the substrate, covering the substrate except at the position of conductor portion 210. A via opening 230 in the dielectric layer 220 provides a connection between the conductor portion 210 and the remaining part of conductor 50.

On the left hand side of FIG. 3 the first leg 110 of the first conductor 40 is shown, and on the right hand side of FIG. 3 the third leg 130 of conductor 40 is shown. The thickness of the conductors is T=1 micrometer, as indicated in FIG. 3 and the conductors are made of aluminium having a conductivity of $3.5 * 10^7$ S/m.

The above described embodiment of the inductance device provides a resistance value of 1.3 Ohm at 1 GHz, which is about half of the resistance value for a single loop. This reduction of the resistance leads to an increased Q-value for the inductance device, as discussed below.

Figure 4:
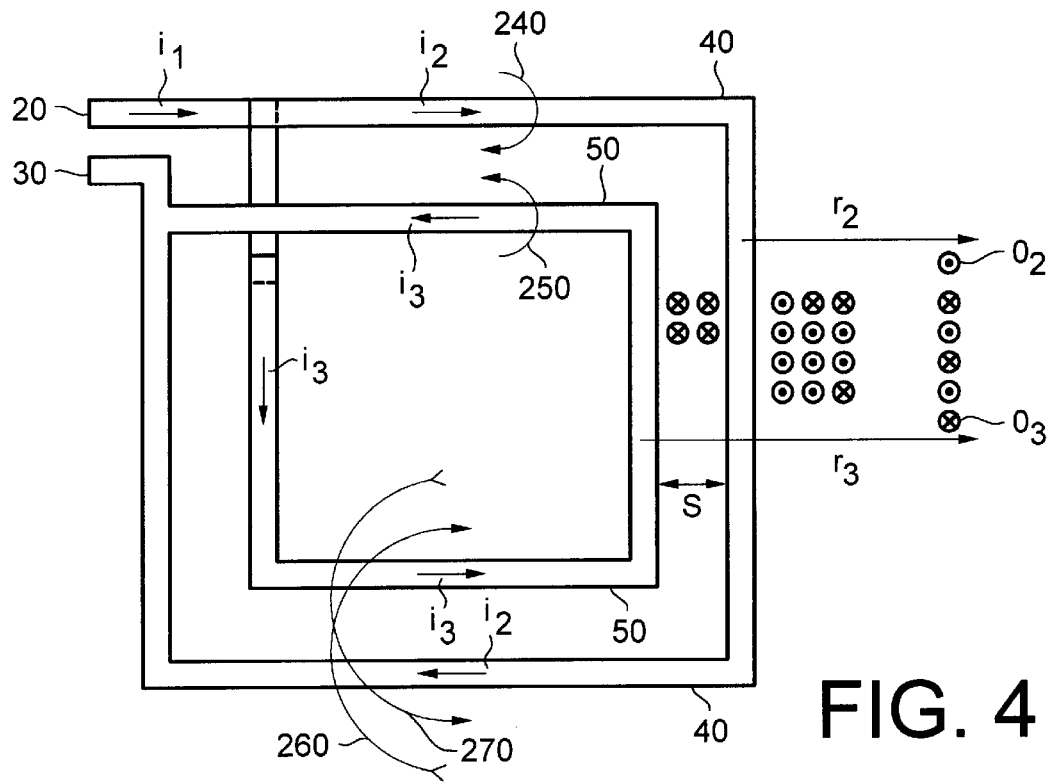
FIG. 4 is a top plan view of the inductance device shown in FIG. 2, including illustration of magnetic flux lines.

FIG. 4 is a top plan view of the inductance device for illustrating its function. A current $i_1$ fed into terminal 20 is divided between the conductors 40 and 50 at the junction 80 such that a current $i_2$ flows into conductor 40 and a current $i_3$ flows into conductor 50.

The current $i_2$ gives rise to a magnetic field near the conductor, with a direction as illustrated by magnetic flux line 240. In the same manner current $i_3$ gives rise to a magnetic field near conductor 50, with a direction as illustrated by magnetic flux line 250. As illustrated in FIG. 4 the magnetic fluxes from the two conductors are superimposed in the space between the conductors in such a manner that the magnetic flux 240 co-operates with the magnetic flux 250. Thereby the total magnetic flux in the space between the conductors is increased. In other words, the magnetic flux generated by the current $i_2$ and the magnetic flux generated by the current $i_3$ superimpose and re-enforce the magnetic flux in a space between the conductors.

The current $i_2$ also gives rise to a magnetic field further away from the conductor 40, as illustrated by magnetic flux line 260. Magnetic flux line 270 illustrates the field generated by current i3 in conductor 50. From FIG. 4 it will be understood that the magnetic field far from conductor 40 will be opposed to the magnetic field far from conductor 50. Hence, the net magnetic far field will be effectively reduced, or cancelled. This has the advantage of reducing or eliminating the electromagnetic interference effect on other circuits or components placed next to a circuit including the inductance device 10.

From electromagnetic theory it will be remembered that the magnetic field strength from a current decreases with the distance r from the conductor in which the current flows. From FIG. 4 it will be intuitively understood that at a distance which is much bigger than the distance S between the conductors the magnetic field generated by current i3 will approach the value of the magnetic field generated by current i2, but with the opposite direction, when the amplitude of current i2 equals that of i3.

Hence, the magnetic fields will cancel each other and the net magnetic field far from inductance device 10 approaches zero. The principle for this effect is illustrated in the right hand side of FIG. 4, where a ring with a dot in it illustrates a magnetic flux line directed out of the paper towards the reader, and a ring with an X in it illustrates a magnetic flux line directed into the paper. Current $i_2$ generates flux $\Phi_2$ at a distance $r_2$ from conductor 40. Current $i_3$ generates flux $\Phi_3$ at a distance $r_3$ from conductor 50. When $r_3-r_2 \gg S$ the fluxes $\Phi_2$ and $\Phi_3$ substantially cancel each other, because they are approximately of equal value and opposed.

The quality factor Q of a circuit is commonly defined as the ratio of the reactance of the circuit to its equivalent series resistance. For a circuit having an inductance and a series resistance this renders the following expression:

$$Q = \omega L / R \qquad (1)$$

Compared to conventional inductors the inductance device 10 provides a higher Q value for a specified inductance. One aspect of this effect can be understood intuitively from the design of the inductance device shown in FIG. 4, considering the series resistance of conductors 40 and 50. From an electrical resistance point of view conductors 40 and 50 can be considered as two parallel resistors. The net resistance of two parallel resistors is lower than the resistance of an individual resistor. Applying the above definition of quality factor to the inductance device 10 it will be realised that decreasing the resistance renders the denominator R a lower value, thereby increasing the Q-value. Hence, the inductance device 10 provides a higher Q value for a specified inductance.

The inductance value L and the resistance value R, and the corresponding Q-value, provided by inductance device 10 can be calculated by applying Maxwell's equations to the structure described above with reference to FIGS. 2 and 3. From Maxwell's equations it is realised that the inductance value is obtainable as follows:

$$L = \operatorname{Re}\left[\int_{V_{coil}} \vec{A}\vec{J}^* \, dV\right] / I^2 \qquad (2)$$

where $\overline{A}$ is the vector potential;

$\vec{J}^*$ is the complex conjugate of the current density vector;

$V_{coil}$ is the volume of the conducting coil; and

I is the input current to the coil;

The resistance R of the inductance device 10 is obtainable from the following expression:

$$R = \left[ \int_{V_{coil}} (\vec{J}\vec{J}*/\sigma) dV \right] / I^2 \quad (3)$$

where σ is the conductivity of the conductor.

Using equations (2) and (3) in equation (1) renders the Q-value for the inductance device 10.

For the purpose of verifying the function of the inductance device 10 at an early stage, the inventors performed numerical three dimensional electromagnetic field simulation on a computer using software tools well known to the person skilled in the art, such as the analysis module ELECTRA™ and OPERA-3d™ from Vector Fields Ltd in England.

A passive inductance device 10 according to the invention is suitable for providing in an integrated circuit. According to the embodiment described above, with reference to FIGS. 2 and 3, the inductance device 10 can be produced with the use of conventional silicon CMOS manufacturing technology. The manufacturing process for the inductance device 10 is substantially the same as that for manufacturing conventional spiral inductors. The fact that conventional manufacturing technologies can be used without any alterations and without any additional active circuitry means that the manufacture of an integrated version of the inductance device 10 can made at low costs.

Figure 5:
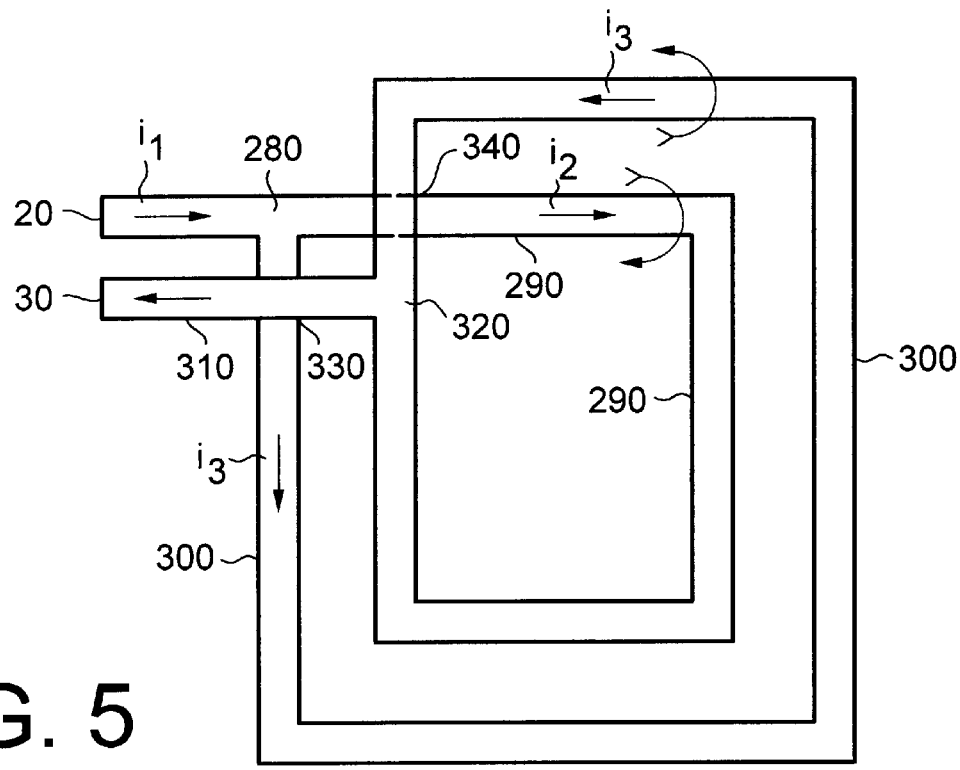
FIG. 5 is a top plan view of an inductance device according to a second embodiment of the invention.

FIG. 5 is a top plan view of an inductance device according to a second embodiment of the invention. A current $i_1$ is fed into the first terminal 20 and at a junction 280 it is divided into a second current $i_2$ and a third current $i_3$. From junction 280 the second current $i_2$ flows in an inner conductor loop 290 and the third current $i_3$ flows in an outer loop 300. A conductor portion 310 connects terminal 30 with the inner loop at a junction 320. Between the terminal 30 and the junction 320 conductor 310 passes over the conductor 300 at 330. The outer loop conductor 300 is connected to the junction 320 via a cross over 340.

Figure 6:
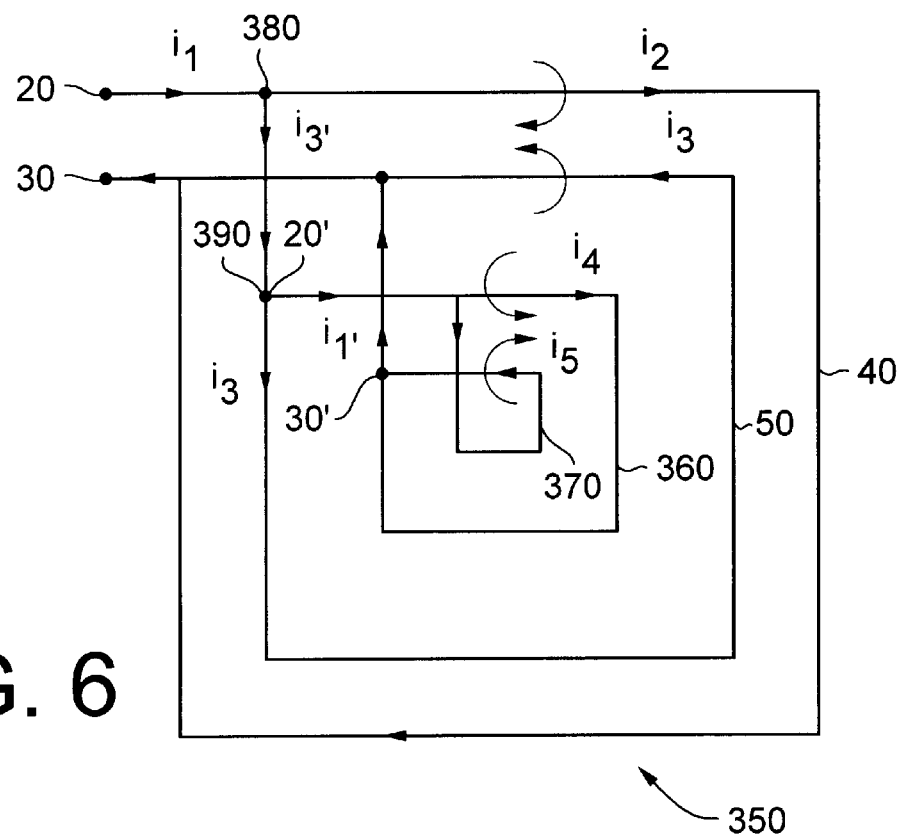
FIG. 6 is a schematic representation of a third embodiment of the inductance device.

FIG. 6 is a schematic representation of a third embodiment of the inductance device. The inductance device 350 shown in FIG. 6 includes two further conductor loops 360 and 370 contained in the middle of an inductance device as described with reference to FIG. 4 above. In this manner four loops are defined, one contained within the other, and a current $i_1$ introduced into terminal 20 is divided into four currents $i_2$, $i_3$, $i_4$ and $i_5$. These conductor loops 40, 50, 360 and 370 are coupled such that the magnetic fields generated by the conductor currents are coincident in the space between two adjacent conductors. In other words, the magnetic flux generated by two neighbouring planar conductors and directed orthogonally to the plane of the conductors is reinforced.

FIG. 6 indicates that a current $i_1$ which is fed into the first terminal 20 is divided into a current $i_2$ and a current $i_3'$ at a junction 380. The current $i_3'$ is divided into a current $i_3$ and a current $i_1'$ at a junction 390. The current $i_1'$ feeds the two inner loops.

Figure 7:
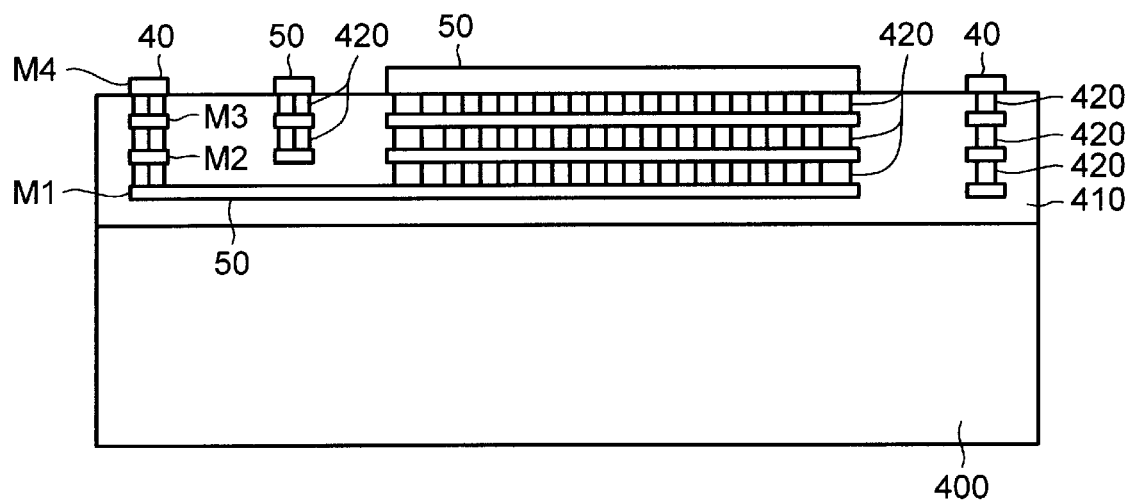
FIG. 7 is a sectional side view of an inductance device similar to the one shown in FIG. 2, when manufactured according to a fourth embodiment.

According to a fourth embodiment of the invention, the series resistance of an individual conductor loop is reduced. This is achieved by providing thicker metal wires which are realized in standard silicon technology by connecting multiple metal layers with via arrays. Such multiple metal layers with via arrays is described in the article "Microwave Inductors and Capacitors in Standard Multilevel Interconnect Silicon Technology" (IEEE Transactions on Microwave Theory and Technique, Vol. 44, No 1 January 1996), the contents of which is hereby incorporated by reference. In this manner an inductance device having the geometry as shown in the plan view of FIG. 2 can be obtained. FIG. 7 is a sectional side view along A—A, as seen in the direction of arrows A, of an inductance device similar to the one shown in FIG. 2, when manufactured according to the fourth embodiment.

The FIG. 7 embodiment provides a monolithic microwave integrated circuit wherein the loops are manufactured using BiCMOS technology. As illustrated in FIG. 7 the silicon substrate has four conductor layers referred M1, M2, M3 and M4. The substrate 400 is a p-silicon substrate with oxide 410. For the purpose of obtaining thicker conductors, there are provided vias 420 to connect the layers M1, M2 M3 and M4, as illustrated. Hence, an inductance device with the geometry as indicated in FIGS. 2 and 3 can be achieved with multiple conductor layers, thereby further reducing series resistance and increasing the Q-value.

Figure 8:
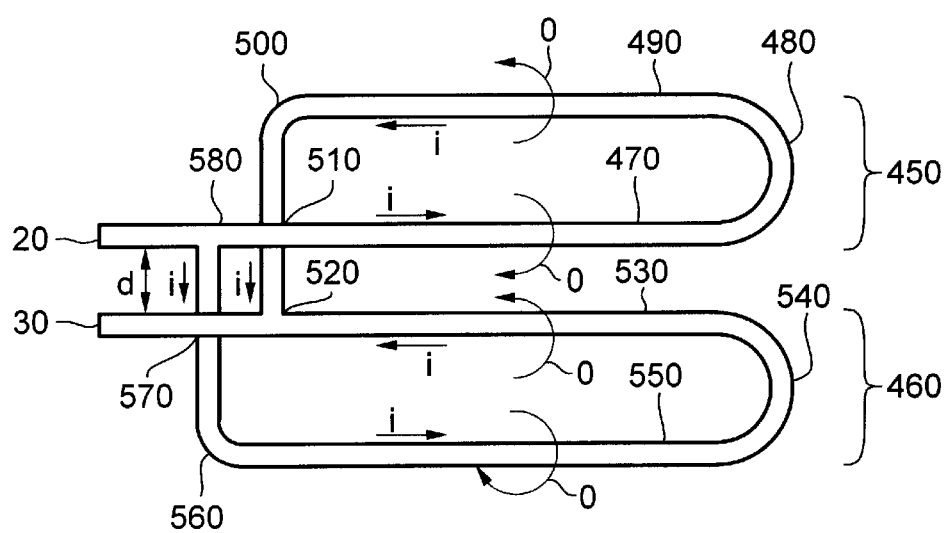
FIG. 8 is a schematic representation of yet another embodiment of the inductance device.

FIG. 8 is a schematic representation of yet another embodiment of the inductance device. The inductance device includes a terminal 20 and a terminal 30 and two conductor loops 450 and 460, respectively, for electrically connecting the terminals. The first loop 450 is an elongated conductor which, starting from terminal 20, has a first part 470 of a certain first length, a 180 degree turn 480, a second part 490 which runs parallel with the first part 470, a 90 degree turn 500 and an underpass 510 before it joins a conductor junction 520 connected to the second terminal 30. The second loop 460 is an elongated conductor which, starting from terminal 30, has a first part 530 of a certain second length, a 180 degree turn 540 away from the first loop, a second part 550 which runs parallel with the first part 530, a 90 degree turn 560 and an underpass 570 before it joins the first part 470 of the first loop 450 at a junction 580. The second length is preferably substantially equal to the first length. The geometry of the inductance device is such that a current introduced into terminal 20 will run counter-clockwise in both loops. Moreover the geometry is such that, along a major part of the loop length, the direction of the current in one conductor stretch 470 is anti-parallel to the direction of the current in an adjacent conductor stretch 490, 530. Hence, the magnetic near field generated by each conductor current combines with the magnetic near field generated by the current in an adjacent conductor such that the combined magnetic field in a space between the conductors is greater than the magnetic field generated by each of the conductors in that space.

Although the above explicitly describes two loops and four loops, respectively, it is to be understood that the invention is not limited to those numbers of loops. By eliminating the innermost loop in FIG. 6, for example, there is provided an inductance device with three loops. Alternatively an additional number of loops can be arranged around the loop 40 or within the loop 370. Hence, the scope of the invention includes a multi-loop inductance device.

The square loops shown in the figures are merely examples. It is also within the scope of the invention to provide loops with other geometry, such as hexagonal or circular conductor loops.

The described inductance device can also be manufactured in other manners within the scope of the claims, e.g. with conductors on thick film circuits and thin film circuits.

What is claimed is:

1. An inductance device, comprising:
   a first terminal and a second terminal, and
   at least two conductors, each conductor forming a loop between the terminals such that a current provided to the first terminal is divided between the conductors, each current generating a magnetic field;

wherein the conductors are disposed such that a combined magnetic field generated by the conductors in a space between the conductors is greater than the magnetic field generated by each of the conductors in the space between the conductors.

2. The inductance device of claim 1, wherein the conductors are elongated planar conductors.

3. The inductance device of claim 1, wherein the conductors are disposed alongside each other.

4. The inductance device of claim 1, wherein at least one of the conductors is arranged to cross over itself at least once.

5. The inductance device of claim 4, wherein the crossing-over conductor is arranged such that is forms a twisted loop.

6. The inductance device of claim 1, wherein the conductors are adjacent, and the currents in the adjacent conductors flow in opposite directions.

7. The inductance device of claim 1, comprising more than two conductor loops.

8. The inductance device of claim 7, wherein the conductors are adjacent and are coupled such that magnetic fields generated by the conductors are superimposed in a space between two adjacent conductors to produce a superimposed magnetic field that is greater than the magnetic field generated by each individual conductor.

9. The inductance device of claim 1, wherein the first and the second terminals are disposed close to each other.

10. A micro-electronic circuit, comprising an inductance device according to claim 1.

11. An integrated circuit substrate, comprising an inductance device according to claim 1.

12. The integrated circuit substrate of claim 11, comprising a plurality of conductor layers, wherein at least one of the loop conductors employs at least two of the conductor layers along a portion of its length; the layers being interconnected by a plurality of via connections.

13. An inductance device, comprising:

a first terminal and a second terminal; and two conductors, each conductor forming a loop between the terminals;

wherein the conductors are coupled to the terminals such that a current provided to the first terminal is divided between the conductors, and the conductors are disposed such that, along a major part of each loop, a direction of current in a stretch of one conductor is anti-parallel to the direction of current in an adjacent stretch of the other conductor.

* * * * *